(12) United States Patent
Pietsch (10) Patent No.: US 9,199,791 B2
(45) Date of Patent: Dec. 1, 2015

(54) DEVICE AND METHOD FOR BUFFER-STORING A MULTIPLICITY OF WAFER-TYPE WORKPIECES

(75) Inventor: Georg Pietsch, Burghausen (DE)

(73) Assignee: SILTRONIC AG, Munich (DE)

( * ) Notice: Subject to any disclaimer, the term of this patent is extended or adjusted under 35 U.S.C. 154(b) by 713 days.

(21) Appl. No.: 13/530,358

(22) Filed: Jun. 22, 2012

(65) Prior Publication Data

US 2013/0011227 A1    Jan. 10, 2013

(30) Foreign Application Priority Data

Jul. 4, 2011   (DE) .......................... 10 2011 078 614

(51) Int. Cl.
| | |
|---|---|
| *B65G 1/127* | (2006.01) |
| *B65G 47/51* | (2006.01) |
| *H01L 21/677* | (2006.01) |
| *B65G 65/00* | (2006.01) |

(52) U.S. Cl.
CPC ............ *B65G 1/127* (2013.01); *B65G 47/5127* (2013.01); *H01L 21/67769* (2013.01); *H01L 21/67778* (2013.01); *B65G 65/00* (2013.01)

(58) Field of Classification Search
CPC ................ B65G 1/127; B65G 1/0485; B65G 2201/022; B65G 2201/02; B65G 49/085; B65G 65/00; G03B 42/045
See application file for complete search history.

(56) References Cited

U.S. PATENT DOCUMENTS

| | | | | |
|---|---|---|---|---|
| 3,520,396 | A | * | 7/1970 | Lingg Gerhard .......... 198/418.6 |
| 3,578,143 | A | * | 5/1971 | Woodward .................... 198/794 |
| 3,656,608 | A | * | 4/1972 | Lichti ............................ 198/798 |
| 3,769,135 | A | * | 10/1973 | Wallington .................... 264/320 |
| 4,562,650 | A | * | 1/1986 | Nagasawa et al. .............. 34/612 |
| 5,009,303 | A | * | 4/1991 | Lutzke ......................... 198/347.3 |
| 5,018,618 | A | * | 5/1991 | Sjogren ....................... 198/347.3 |
| 5,113,992 | A | | 5/1992 | Sadamori |
| 5,255,773 | A | * | 10/1993 | Pollock ....................... 198/347.3 |
| 5,326,983 | A | | 7/1994 | Hejazi |
| 5,577,595 | A | * | 11/1996 | Pollock et al. .............. 198/347.3 |
| 6,223,881 | B1 | | 5/2001 | Carle |
| 6,423,149 | B1 | | 7/2002 | Crevasse et al. |

(Continued)

FOREIGN PATENT DOCUMENTS

| | | |
|---|---|---|
| DE | 54296 | 11/1967 |
| DE | 4119514 A1 | 12/1992 |

(Continued)

*Primary Examiner* — Glenn Myers
(74) *Attorney, Agent, or Firm* — Brooks Kushman P.C.

(57) ABSTRACT

A multiplicity of wafer-type workpieces are buffer stored in a device having,
  a frame,
  at least two transport elements which each circulate in a vertical direction around an upper and a lower deflection device connected to the frame and are provided, at uniform intervals, with a multiplicity of bearing areas for the horizontal mounting of workpieces, wherein at least one of the deflection devices of each transport element is driven and a free space is situated between the transport elements,
  a loading position between the upper deflection devices at which a workpiece can be placed onto corresponding bearing areas, and
  a stationary removal device below the loading position, comprising a horizontal transport device, the first end of which lies within the free space between the transport elements. The invention also relates to a method for buffer-storing a multiplicity of wafer-type workpieces using the abovementioned device.

12 Claims, 5 Drawing Sheets

(56) References Cited

U.S. PATENT DOCUMENTS

| | | |
|---|---|---|
| 7,766,724 B2 | 8/2010 | Huber et al. |
| 8,191,702 B2 * | 6/2012 | Itoh et al. ............... 198/801 |

FOREIGN PATENT DOCUMENTS

| | | |
|---|---|---|
| DE | 102008060014 A1 | 5/2010 |
| JP | 59-227612 | 12/1984 |
| JP | 62136427 A | 6/1987 |
| JP | 62-238636 | 10/1987 |
| JP | 62176114 U | 11/1987 |
| JP | 63-185576 U | 11/1988 |
| JP | 3-106721 | 5/1991 |
| JP | 3216404 | 9/1991 |
| JP | 06-321317 | 11/1994 |
| JP | 7-254418 | 1/1995 |
| JP | 2000-44018 | 2/2000 |
| JP | 2006032528 A | 2/2005 |
| KR | 1020000044018 A | 7/2000 |
| WO | 2010-057671 A3 | 5/2010 |

* cited by examiner

DEVICE AND METHOD FOR BUFFER-STORING A MULTIPLICITY OF WAFER-TYPE WORKPIECES

CROSS-REFERENCE TO RELATED APPLICATIONS

This application claims priority to German Patent Application No. DE 102011078614.7 filed Jul. 4, 2011 which is herein incorporated by reference.

BACKGROUND OF THE INVENTION

1. Field of the Invention

The present invention relates to a device and a method for buffer-storing a multiplicity of wafer-type workpieces vertically one above another and individually without the workpieces touching one another. The device comprises a frame, at least two transport elements which circulate in a vertical direction and which are provided, at uniform intervals, with a multiplicity of bearing areas for the horizontal mounting of workpieces, a loading position and a stationary removal device.

2. Background Art

Various products in modern industry require semifinished products in the form of very precisely processed wafer-type workpieces. These are, for example, annular wafers composed of glass or aluminum as substrates for the production of magnetic mass storage devices (hard disks) for computers, optical glasses, highly level reference surfaces for optical purposes (so-called "Flats"), multicrystalline semiconductor wafers for the production of photovoltaic cells, etc. Particularly stringent requirements are made of monocrystalline semiconductor wafers as starting material for functional components appertaining to electronics, microelectronics and microelectromechanics.

Semiconductor wafers are produced by means of a multiplicity of successive process steps that can generally be classified into the following groups:
(a) production of a usually monocrystalline semiconductor rod;
(b) slicing of the rod into individual wafers;
(c) mechanical processing;
(d) chemical processing;
(e) chemomechanical processing;
(f) if appropriate additional production of layer structures.

What are advantageous and therefore frequently used in the production of semiconductor wafers are particularly those processes from groups (b) to (f) in which a plurality of semiconductor wafers are processed simultaneously in one device. This form of processing is called group processing or a batch process. Batch processes from group (b) include, for example, multi-wire slicing (MWS), from group (c) lapping or grinding with planetary kinematics, from group (d) etching or chemical cleaning in a bath, and from group (e) double-sided polishing (DSP) using silica sol, for example.

What is common to all the batch processes mentioned is that, at the end of a processing cycle, a plurality of processed semiconductor wafers are obtained simultaneously or within a short time for further processing. Therefore, in contrast to single-wafer or continuous processing methods, batch processes are distinguished by a temporally nonuniform material flow.

Prior to further processing, it is necessary to clean the semiconductor wafers in order to remove the lapping agent adhering to the semiconductor wafers after MWS or lapping processing or the polishing agent adhering after DSP or the grinding slurry adhering after grinding processing. Preferably, the cleaning is effected directly after the preceding lapping, grinding or polishing processing, as long as the semiconductor wafers are still wet, since lapping or polishing agent or grinding slurry, once it has dried in, adheres very strongly to the surface or even damages the latter.

The prior art discloses a multiplicity of cleaning methods which are in each case tailored to the type of contamination present and the degree of cleanness to be achieved. These methods are subdivided into batch cleaning methods, in which a plurality of semiconductor wafers are cleaned simultaneously in one cleaning device, and single-wafer cleaning methods, in which the semiconductor wafers are cleaned individually and successively, either cyclically sequentially or continuously in continuous cleaning methods.

U.S. Pat. No. 6,423,149 BA describes, for example, a cleaning device, comprising a plurality of pairs of mutually opposite cylindrical sponges which rotate about their longitudinal axes and between which semiconductor wafers are led through individually successively in a continuous passage movement by means of conveyor belts and, by means of contact and relative movement of sponge and semiconductor wafer surfaces with respect to one another and the supply of a cleaning liquid, both sides of the semiconductor wafers are cleaned simultaneously (single-wafer cleaning method with continuous passage).

Cleaning methods of this type have proved to have particularly high performance. However, these methods always operate with cyclic or continuous passage of individual semiconductor wafers, since each surface of each semiconductor wafer fed for cleaning has to be swept over completely by a cleaning tool. This is not possible in batch cleaning methods.

Consequently, in many cases there is the problem that semiconductor wafers obtained in bunches after processing in a batch process have to be separated and fed for cleaning successively cyclically or with continuous passage.

Furthermore, for reasons of economic viability, it is undesirable that, for example, the installation operator who unloads the semiconductor wafers after processing by a batch process and feeds them manually for subsequent cleaning adapts his unloading pace to the cleaning throughput, since this leads to waiting times, increased outlay on operating personnel, reduced material throughput and quality losses. Quality losses can arise in the case of DSP, for example, if polishing agent adhering to the surface of the semiconductor wafer dries thereon.

In addition, it is necessary in many cases for the semiconductor wafers to be fed for cleaning in direct proximity to the removal from the batch process, in order to avoid a change in the properties of the semiconductor wafer, for example as a result of oxidation or incipient etching caused by residues of a chemically active processing liquid of the batch process that have remained on the semiconductor wafer, and in order, in the case of manual transport, for example, to increase the ergonomics and work safety and in order to minimize the risk of damage to the semiconductor wafer as a result of careless handling, the risk of interchange of front and rear sides of the semiconductor wafer as a result of unintentional rotation, or the risk of interchange of the order of the semiconductor wafers removed from the batch process on the transport path.

Finally, it is often desirable for each batch processing device to be assigned exactly one cleaning device, for example in order to avoid mixing up semiconductor wafers from different batch processing devices, and for the cleaning device to be able to be embodied in a very compact and space-saving fashion, in order that it can be retrofitted to an existing batch processing device, for example, without having to interrupt the batch processing operation for a long time or even having to change the disposition of the batch processing device.

The prior art discloses devices which can pick up a multiplicity of wafer-type workpieces individually successively or simultaneously and release them again. These devices are designated as "buffer stores", "buffers" or the like. For semiconductor wafers, these temporary storage or stacking devices are designated as "wafer stockers".

JP2006-032528A describes, for example, a device comprising four pairs of continuous (closed) chains, of which the two chains in each pair are connected to one another by sprockets. Two first chain pairs are led by means of two respective deflection roller pairs in the form of a closed inner ring. The two remaining chain pairs are led by means of four respective deflection roller pairs in each case concentrically with respect to one of the first two chain pairs (inner rings) in a likewise closed outer ring around the first chain pairs, such that two pairs of inner and outer chain pairs are respectively opposite one another. In this case, all the chains in the first half of each chain pair run in a common first plane and the chains in the other half of each chain pair run in a second plane, which is arranged parallel to the first plane. Furthermore, all the sprockets of all the chain pairs also run parallel to one another.

Planar workpieces, for example glass plates for Flat-Panel-Displays, can be placed onto the sprockets, such that each workpiece is supported by four sprockets. As a result of the synchronous driving of all the deflection rollers, the sprocket network can be adjusted in height, such that a multiplicity of workpieces can be stacked one above another without touching one another. In this case, the workpieces are led in a horizontal position by transport rollers to a loading position and, as a result of synchronous driving of all the deflection rollers, are brought into contact with the sprockets situated below the workpiece and are conveyed upward by one distance between sprockets by the latter. The next workpiece can then be fed as described to the subsequent sprockets, etc., with the result that finally a stack of all the workpieces thus supplied arises. Unloading takes place analogously to loading by means of the workpieces being progressively moved down to the unloading position, which is identical to the loading position, with the workpiece being transported out of the device by means of transport rollers. Loading and unloading proceed in the same direction and at opposite sides of the two concentric chain ring pair arrangements.

On account of the construction of the buffer store from JP2006-032528A, the workpiece introduced into the stack last is the first to be removed again from the stack ("last in first out" principle, LIFO). Thus, the order in which the workpieces are supplied during loading is reversed during unloading. Moreover, only exactly one workpiece can be either loaded or unloaded respectively at a point in time. Therefore, it is not possible, in particular, to pick up a plurality of semiconductor wafers within a short time from a preceding batch processing process and to simultaneously remove them individually again successively in time with the subsequent cleaning and in the order of inclusion in the stack ("first in first out" principle, FIFO).

Moreover, the buffer store described in JP2006-032528A also does not permit fast direct loading by hand, for example by an installation operator who removes the semiconductor wafers after the end of the preceding batch processing process rapidly, successively and in a manner maintaining the order from the processing device, since loading takes place by means of the transport rollers through between the sprockets. This movement can take place only comparatively slowly since the semiconductor wafer has to be moved for this purpose by a distance corresponding at least to its diameter, and it therefore constitutes the speed-determining step. The workpieces would additionally have to be placed onto the moving transport rollers, which would inevitably lead to undesirable friction between transport rollers and workpiece.

Moreover, the lateral loading necessitates an additional space requirement of such a device, as a result of which it cannot simply be attached to the processing device that supplies the semiconductor wafers, or it cannot easily be retrofitted if necessary without in general having to shift and rearrange the processing device. In many cases it is even completely impossible to shift the processing device, since, in modern manufacturing sequences, in general a multiplicity of different processing devices are installed at small distances from one another or in predefined building grids, the arrangement of which can no longer be changed subsequently without disturbing the entire processing sequence in the long term or changing it permanently.

Thus, it would be desirable to provide a device and a method which make it possible, after batch processing has taken place, to buffer-store a multiplicity of semiconductor wafers in the true order and in a space-saving manner and to actually feed them during the feeding of semiconductor wafers to the buffer store or directly after the feeding of the last semiconductor wafer, to subsequent single-wafer processing, for example continuous cleaning, with the cyclic timing required therefor and with their original order being maintained. Moreover, it would be desirable for the device to be capable of being manually loaded rapidly and by means of a simple movement, to solve the problems associated with the prior art.

SUMMARY OF THE INVENTION

These and other problems are solved by means of a device for buffer-storing a multiplicity of wafer-type workpieces, comprising
 a frame,
 at least two transport elements which circulate in a vertical direction around in each case an upper and a lower deflection device connected to the frame and which are provided, at uniform intervals, with a multiplicity of bearing areas for the horizontal mounting of workpieces, wherein at least one of the deflection devices of each transport element is driven and wherein a free space is situated between the transport elements,
 a loading position between the upper deflection devices, in which position a respective workpiece can be placed onto the corresponding bearing areas, and
 a stationary removal device below the loading position, comprising a horizontal transport device, the first end of which lies within the free space between the transport elements.

The problems are likewise solved by means of a method for buffer-storing n wafer-type workpieces individually one above another without touching adjacent workpieces in the above-described device, where n denotes an integer that is greater than 1, and wherein the method comprises the following steps in the specified order:
 (a) insertion of a workpiece into the loading position,
 (b) synchronous rolling of the transport elements such that the workpiece is progressively moved relative to the frame by exactly one vertical distance between the bearing areas perpendicular to the workpiece from the loading position downward and the loading position thereby becomes free again, and (c) repetition of steps (a) and (b), until all n workpieces have been inserted, such that a stack of n workpieces arranged one above another and bearing individually on the respective bearing areas has been formed.

Preferably, the method additionally comprises the following additional steps in the specified order:

(d) vertical movement of the stack by in each case one vertical distance between the bearing areas downward until the bottom-most workpiece bears on the removal device, (e) removal of the bottom-most workpiece from the stack by means of a horizontal movement of the removal device and (f) repetition of steps (d) and (e), until all n workpieces have been removed from the stack.

BRIEF DESCRIPTION OF THE DRAWINGS

FIG. 2 (A) shows a side view of one embodiment of the device according to the invention in a first operating state.

FIG. 2(B) shows a side view of one embodiment of the buffer store according to the invention in a second operating state.

DETAILED DESCRIPTION OF THE PREFERRED EMBODIMENT(S)

The device according to the invention is described below with reference to FIGS. 1 to 3. The device according to the invention is also designated hereinafter as "buffer store" for short.

Figure 1:
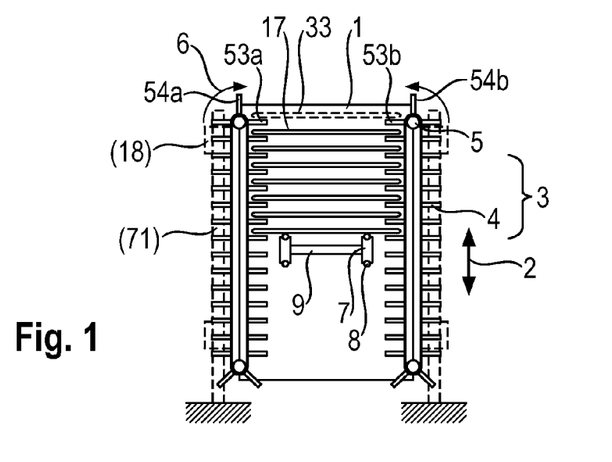
FIG. 1 shows a front view of one embodiment of the buffer store according to the invention.

FIG. 1 shows an excerpt from the device, comprising a frame 1 and a plurality of transport elements 3 circulating in a vertical direction (also designated as "vertical transport elements" in this description), in a front view. The frame 1 can be open or embodied as a partly closed housing. The vertical transport elements 3 have bearing areas 4 and run as a closed ring via deflection devices 5.

The vertical transport elements 3 are flexible at least in one direction and allow deflection by means of the deflection devices 5. At the same time, expansion of the vertical transport elements in a longitudinal direction should be avoided. By way of example, belts, strips or chains can be used as vertical transport elements 3. In particular, toothed belts can be used as vertical transport elements, the teeth of which form the bearing areas.

The number of vertical transport elements 3 is chosen depending on the size and form of the workpieces for which the buffer store is provided. The arrangement of the vertical transport elements and thus of the bearing areas has to enable the workpieces to be supported securely. By way of example, an arrangement of four vertical transport elements along the four vertical edges of an imaginary parallelepiped is possible. This arrangement is suitable, in particular for rectangular workpieces. An arrangement of three vertical transport elements running parallel is also possible. Two of the vertical transport elements are opposite one another, such that their bearing areas support the workpieces on two opposite sides. The third vertical transport element is at right angles to the first two vertical transport elements. Its bearing areas support the workpieces on a third side. The fourth side remains free in order to enable the workpieces 17 to be removed from the stack. It is also conceivable for the two vertical transport elements situated opposite one another and their bearing areas to be made wider, such that the bearing areas can securely support the workpieces on opposite sides and the third transport element can be dispensed with.

For round workpieces such as monocrystalline semiconductor wafers, for example, the embodiment illustrated in FIGS. 3(A) and 3(B) is particularly preferred: this embodiment provides, as described above, four vertical transport elements 3 running along the vertical edges of an imaginary parallelepiped, in which case, however, two of the vertical transport elements 3 respectively have common bearing areas 4 which connect the two relevant vertical transport elements 3. The bearing areas 4 are preferably embodied with a centering device 20 in the form of a connecting web having a depression 65, the form of which is adapted to the form of the workpieces 17 and which therefore provides for a lateral guidance of the workpieces 17 and facilitates the positionally accurate insertion of the workpieces by the installation operator or the automation.

The deflection devices 5 are fixed to the frame 1. If belts or strips are used as vertical transport elements 3, rollers are suitable as deflection devices. If the vertical transport elements 3 are chains (in particular articulated chains), gearwheels are preferably used as deflection devices 5.

The vertical transport elements 3 can perform simultaneously and in the same way (synchronously) a movement 6 by multiples of the distance between the bearing areas 4. The distances between the bearing areas 4 and the diameter of the deflection devices 5 are preferably dimensioned such that the topmost bearing areas 53a and 53b are precisely horizontal when the subsequent bearing areas 54a and 54b are perpendicular to the upper deflection devices 5.

The vertical transport elements 3 or their deflection devices 5 that guide them are at such a distance from one another that precisely one workpiece 17 (for example one semiconductor wafer) has space between them.

A loading position 33 (see FIGS. 1 and 2) for a newly inserted workpiece 17 is situated between the upper deflection devices 5 and is delimited by the horizontal topmost bearing areas 53a and 53b, on which the workpiece 17 is placed, and the preferably perpendicular topmost bearing areas 54a and 54b, that guide the workpiece 17 in a horizontal direction.

The buffer store has below the loading position 33 a stationary removal device, by means of which a workpiece can be withdrawn from the bottom-most position of the stack of workpieces 17 in order to unload it from the buffer store. The removal device substantially consists of a horizontal transport device. The latter is positioned such that it projects into the space between the vertical transport elements 3 to an extent such that it can be brought into contact with the bottom-most workpiece of the stack by corresponding lowering of the stack and can support said workpiece and transport it out of the buffer store. FIGS. 1 and 2 show by way of example a horizontal transport device formed from deflection rollers 7, transport belt 8 and spindle 9. However, the horizontal transport device can also be a conveyor belt or a roller conveyor.

FIG. 2(A) shows the device shown in FIG. 1 in a lateral overall view with further elements that are not illustrated in FIG. 1. The circulating movement 6 of each of the vertical transport elements 3 is made possible by in each case at least one driven deflection device 5. This can be the lower or the upper deflection device 5. In the embodiment illustrated in FIG. 2(A), the vertical transport elements are belts and the deflection devices 5 are deflection rollers, wherein the lower deflection rollers 5 are driven. In each case two of the lower deflection rollers 5 are mounted on a common shaft 12, which can be caused to effect a rotational movement 13 by a drive 11. The two other lower deflection rollers 5 are mounted on a further shaft 12, which lies behind the shaft 12 illustrated in FIG. 2(A) and is hidden thereby. The two shafts 12 can be driven with a suitable force transmission by a common drive 11 or by two separate drives 11. Each shaft 12 drives the deflection rollers 5 for the belts 3 by rotation 13 and thus enables an adjustment of the belts 3 by multiples of the distances between the bearing areas 4 downward. As a result, the stack formed from workpieces 17 can be moved downward relative to the frame 1 by means of the belts 3.

The frame 1 is movable in a vertical direction relative to the removal device in a first embodiment of the invention, whereas it is stationary, i.e. not movable relative to the removal device, in a second embodiment.

Figure 2:
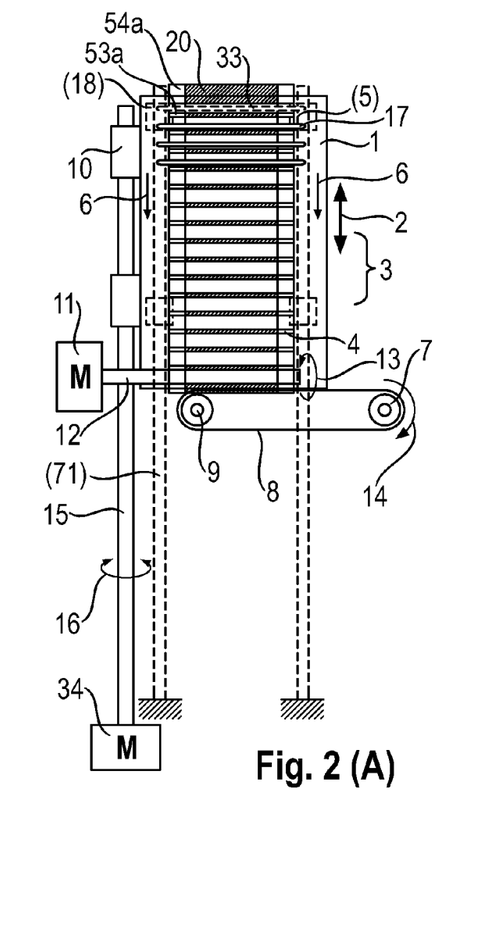

FIG. 2(A) illustrates the first embodiment of the buffer store according to the invention with a vertically movable frame 1. The vertical movement 2 of the frame 1 is produced by a drive 34. Preferably, the drive 34 drives a shaft 15 to effect a rotational movement 16, wherein shaft 15 is embodied as a threaded rod that engages into threaded bushes 10 fitted to the frame 1. Consequently, a vertical movement 2 of the frame 1 is brought about by the rotation 16 of the shaft 15. By way of example, guide bushes 18 fitted to the frame 1 are shown. The guide bushes 18 guide (likewise shown by way of example) guide rods 71 fixedly connected to the basic framework (not shown) of the entire buffer store. Upon vertical movement 2 of the frame 1, the guide bushes 18 slide on the guide rods 71. As a result, the frame moves with little play exclusively in a vertical direction 2, without rotation in a horizontal direction. (For clearer illustration of the other elements, the guide bushes 18 and guide rods 71 are depicted by dashed lines in FIG. 1, FIG. 2 (A) and FIG. 2 (B).) This type of height adjustment is simple to realize and therefore preferred. However, other types of height adjustment are also possible, for example by means of one or a plurality of chains driven via gearwheels, or by means of a pneumatic lifting device.

FIG. 2(B) shows a side view corresponding to FIG. 2(A), but with a frame 1 moved downward relative to FIG. 2(A) to an extent such that the bottom-most workpiece of the stack becomes situated on the transport belt 8 of the removal device and is withdrawn by rotation 14 of the deflection rollers 9 from the slot between the two adjacent bearing areas 4 of the belts 3 which guide the workpiece in the stack, such that the workpiece is removed from the stack (unloading operation).

FIGS. 3(A) and 3(B) show the buffer store in plan view, to be precise FIG. 3(A) with all the stacked workpieces 17 still held in position 19 vertically one above another in the stack (corresponding to the side view in FIG. 2(A)) and FIG. 3(B) with the bottom-most workpiece 17 already half withdrawn from the slot between the bearing areas 4 of the belts 3 in unloading position 20 (corresponding to the side view in FIG. 2(B)). Arrow 37 symbolizes the movement performed by the workpiece bearing on the transport belts 8 during removal from the stack.

FIGS. 3(A) and 3(B) additionally show by way of example four guide bushes 18, through which a respective vertically fitted guide rod 71 is guided. It is also possible to use more or fewer than four guide rods 71.

The embodiments shown in FIG. 1 to FIG. 3(B) solve the problem addressed by the invention generally and in a sufficient manner. However, they have limitations for specific applications. For example, the deflection rollers 5 have to be made very small in order to obtain small distances between the bearing areas 4 carrying the workpieces 17 and thus a desirably compact construction of the buffer store. This can lead to large fracture angles of the vertical transport elements 3 embodied as toothed belts, for example, which can lead to greater wear of the toothed belts. With topmost bearing areas 53*a*, 53*b* lying horizontally in order to accommodate a workpiece in position 33 (FIG. 1 and FIG. 2(A)), the bearing areas 54*a*, 54*b* that follow in the movement direction 6 of the vertical transport element 3 have to be just largely perpendicular, such that the insertion of the workpiece onto the loading position 33 is not blocked. The insertion is effected from above according to the invention.

Alternatively, a particularly compact design can be dispensed with, and the vertical transport elements 3 can be at somewhat greater distances from one another. This leads to a somewhat higher frame 1 overall. While this generally does not impair the functioning of the device, for the case where loading is carried out manually it is preferred, for reasons of ergonomics and in order to achieve a lowest possible susceptibility to loading faults, if the structural height of the frame is as small as possible. As a result of the cyclic progression of the frame during the loading of a batch, the loading position is displaced for the installation operator by a stack distance from semiconductor wafer to semiconductor wafer, and, in the case of particularly dense stacking (housing having a particularly small structural height), this displacement of the loading position is particularly small, which is preferred.

The loading of the buffer store can also be performed automatically, for example by means of a robot arm which removes the semiconductor wafers from the device of the preceding material processing and places them into the loading position 33 of the buffer store. In this case, too, a particularly small structural height of the housing 1 of the buffer store is preferred since the resulting shorter movement distances enable a correspondingly more compact, more positionally accurate, faster and more cost-effective robot.

FIG. 3(C) therefore shows a particularly preferred embodiment of the vertical transport element 3, which allows a particularly small distance between the workpieces 17 that become situated one above another, and hence a particularly low structural height of the frame 1 of the buffer store, in a detail view. The vertical transport element 3 is embodied as a chain, comprising chain links 70 connected by articulations, and bearing areas 4. Articulated chains (bolt, bush or roller chains) are preferably used, particular preference being given to roller chains wherein the articulation between two chain links 70 is formed from a bolt which is connected to the first chain link and which is led through a bush connected to the second chain link. The sleeve is in turn surrounded by a hollow chain roller 69. The chain circulates around deflection rollers 5 having a toothing 67, which engages into the spaces between the chain rollers 69. As a result, the circulation 6 of the chain around the deflection rollers 5 takes place without slip, and the movement of the chain can be carried out precisely and reproducibly, for example by a stepper motor drive of the deflection rollers 5.

In this embodiment, the bearing areas 4 preferably comprise in each case at least one cam 66 projecting perpendicularly from the bearing area 4, and are connected to the chain in a manner rotatable about the articulations. In the exemplary embodiment shown, the rotational or tilting movement 68 of the bearing areas 4 about the articulations of the chain is limited in the clockwise direction when the cam 66 butts against the chain link 70, and in the counterclockwise direction when the bearing area 4 butts against the cam 66 of the adjacent bearing area 4. During the circulation 6 of the chain around the deflection rollers 5, the bearing areas 4 are tilted to a stop in the counterclockwise direction on account of their weight during the upward movement of the chain. Only when a bearing area is transported upward and over the deflection roller 5 to such an extent that its center of gravity is situated to the right of its rotation axis (axis of the chain articulation) does the bearing area 4 tilt in the clockwise direction until its cam 66 stops against a chain link 70. In this case, the cam 66 is dimensioned and positioned at the bearing area 4 such that the bearing area 4 projects precisely horizontally from the chain upon a stop in the clockwise direction.

In the loading position 33 for a workpiece 17 inserted into the buffer store, the bearing area 53a is therefore situated horizontally, while the bearing area 54a that follows in the circulation direction 6 of the chain still bears, in a manner completely tilted in the counterclockwise direction, against the bearing area respectively following it.

By virtue of this embodiment of the vertical transport element 3 as a chain with movable bearing areas 4 and cams 66, the loading position 33 is always accessible, even if the deflection rollers 5 are comparatively large, the chain links 70 are comparatively short or the bearing areas 4 are particularly wide. As a result, workpieces 17 can be mounted one above another with particularly small distances, that is to say a high stacking density, and this results in an advantageous particularly small structural height of the buffer store.

Most preferably, the bearing areas 4 are in this case again provided with a centering device 20 and comprise depressions 65 which center and guide the workpieces (e.g. semiconductor wafers) 17 and thus enable particularly simple "self-finding" loading.

Figure 4:
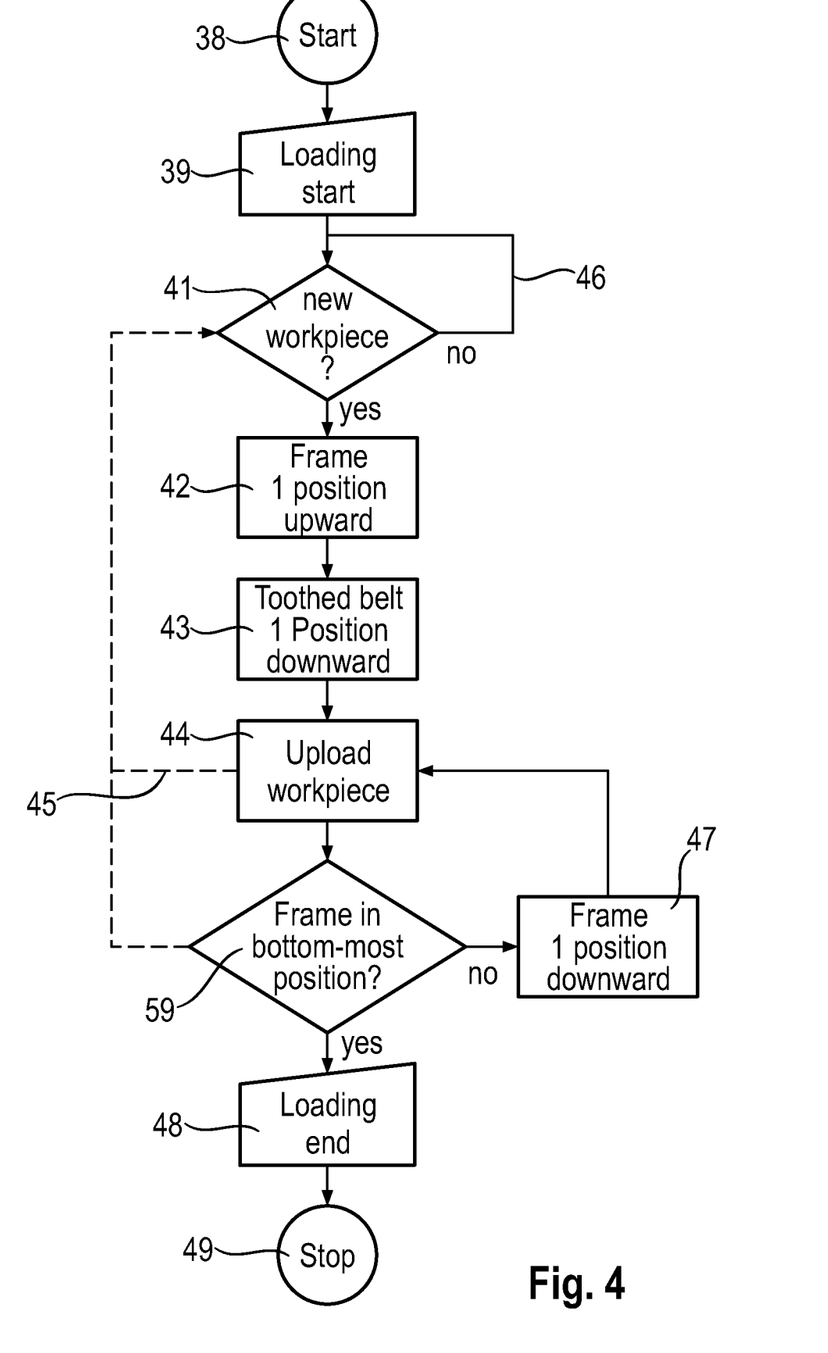
FIG. 4 shows a flowchart for a first embodiment of the method according to the invention (simultaneous loading and unloading of the buffer store).
Figure 5:
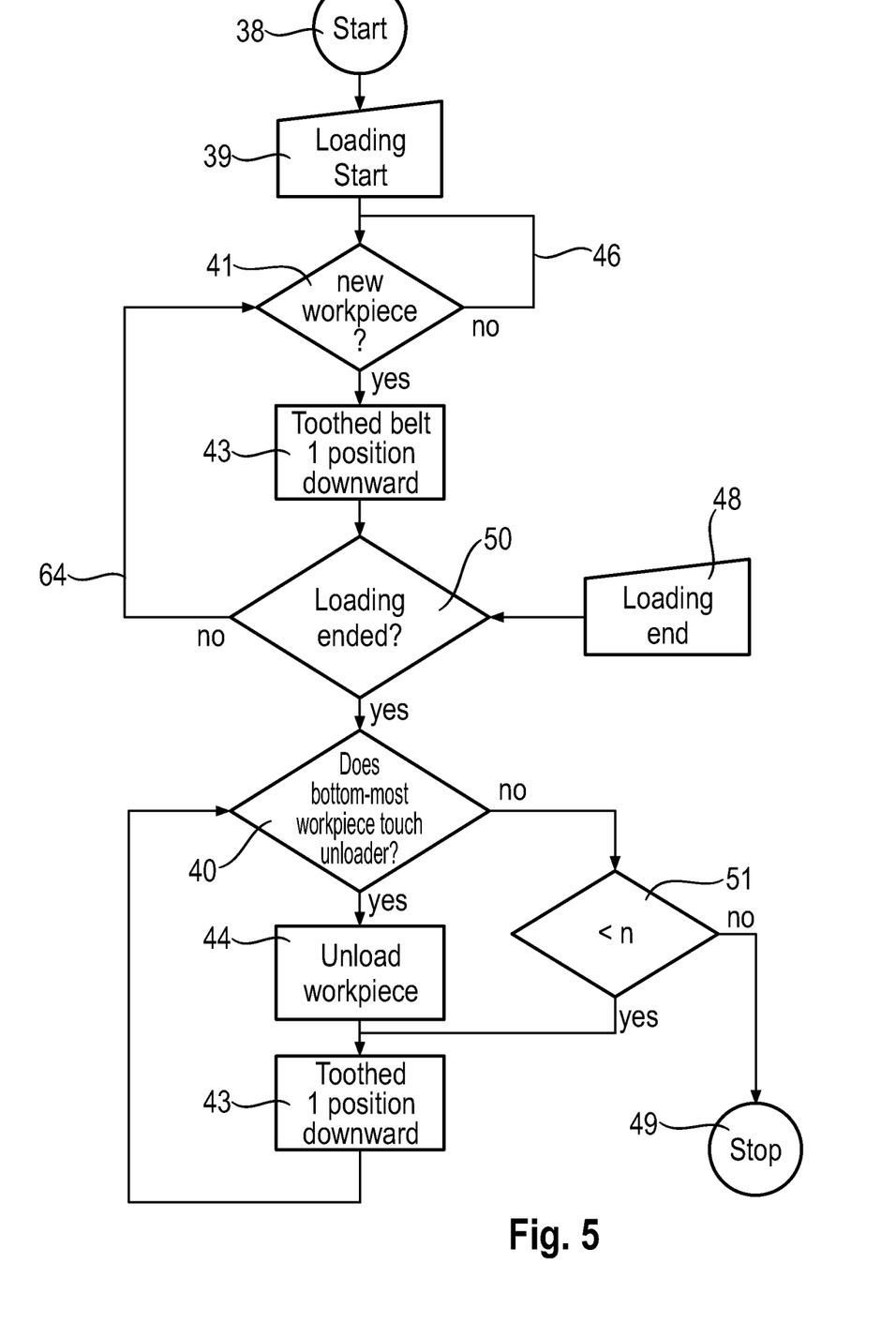
FIG. 5 shows a flowchart for a second embodiment of the method according to the invention (sequential loading and unloading of the buffer store).

The method according to the invention is described in greater detail below with reference to flowcharts (FIG. 4 and FIG. 5). In this case, n workpieces are stacked from the bottom to the top perpendicularly one above another and without touching adjacent semiconductor wafers in the buffer store according to the invention and are removed again from the stack from the bottom to the top in the order of their insertion ("first in first out", FIFO). The n workpieces originate for example from batch processing carried out beforehand and are unloaded from the processing device in a comparatively short time and fed to the buffer store according to the invention.

FIG. 4 shows a first embodiment of the method, wherein the stack is built up in a first cycle, with which the workpieces are provided from the prior process, and at the same time, during the stack build-up, the stack is taken down again from the bottom in a second cycle, with which the workpieces are intended to be fed to subsequent processing (for example cleaning). In this case, the first cycle (feeding to the stack) is faster than the second cycle (removal from the stack), such that during the stack build-up and take-down process workpieces are always available in the stack and, as a result, no waiting times occur during removal in the second cycle.

Figure 3:
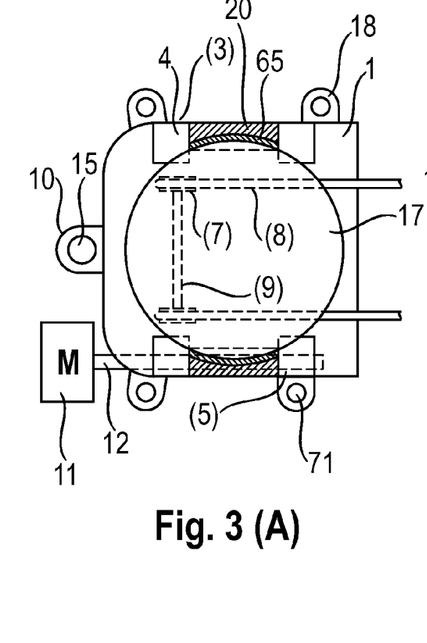
FIG. 3(A) shows a plan view of one embodiment of the buffer store according to the invention.
FIG. 3(B) shows a plan view of one embodiment of the buffer store according to the invention during the removal of a semiconductor wafer.
FIG. 3(C) shows a side view of one embodiment of the vertical transport element as a chain.

The device features required for the description of the method are illustrated in FIGS. 1 to 3. For the first embodiment of the method, the first embodiment of the buffer store according to the invention is used, wherein the frame 1 is movable relative to the removal device in a vertical direction. The vertical movement of the stack in accordance with step (d) is effected by means of a vertical movement of the frame relative to the removal device.

The method starts (38) by the installation operator pressing a start button on the device, for example, or by an unloading automation of the preceding processing process signaling to the stacking device that the feeding of workpieces is beginning (39). A sensor, for example a reflected light barrier, checks (41) whether a new workpiece 17 has been placed on loading position 33. As long as no new workpiece has been placed, interrogation 41 is in the waiting loop 46. As soon as a workpiece has been placed (step (a) of the method), the entire frame 1 is moved (42) upward by one position (that is to say by a distance corresponding to the distance between two adjacent bearing areas 4) and the vertical transport elements 3 (designated as "toothed belts" in the flowchart) are moved downward by one position (43; step (b) of the method). The movements 42 and 43 can be effected sequentially in the stated order or synchronously. This ensures that a workpiece 17 possibly already situated in unloading position 20 on the removal device (for example on a transport belt 8) is not moved deeper than as far as the unloading position 20, as a result of which the workpiece would shatter. At the same time, however, the stack of workpieces already formed is moved downward by one position within the frame 1. The frame 1 and therefore the loading position 33 lie one position higher than before after steps 42, 43.

If a bottom-most workpiece is in unloading position 20 after steps 42 and 43, it is unloaded by means of the removal device (e.g. transport belts 8) (44; step (e)). If no workpiece is in unloading position 20 after steps 42 and 43, nothing happens, and the removal device grabs at thin air. An interrogation is not necessary. At this point in time, a new workpiece can already be inserted in loading position 33. The control of the device enables the partial flow (dashed line 45) formed from steps 41 to 44. Therefore, it is possible simultaneously for new workpieces to be added to the stack from above and to be removed from the stack from below.

As long as the subsequent interrogation 59 ("is the frame 1 in the bottom-most position?") is answered in the negative, the frame 1, after the unloading 44 (step (e)) of a workpiece 17, is in each case moved downward by a further position (47; step (d)), and further workpieces 17 are unloaded (44; repetition of step (e)). In this case, the loading position 33 for new workpieces remains free and is available for simultaneous addition of further workpieces to the stack (step (a)). Moreover, the vertical transport elements 3 and with them the stack already formed are not moved downward relative to the stack, such that no gaps arise between workpieces already lying in the stack and newly added workpieces.

Loop 47 is iterated until the frame is finally in the bottom-most position. If this is the case, the stack is completely unloaded, and the entire loading and unloading operation is stopped either by the installation operator, for example by pressing a button, or by notification by an unloading automation of the preceding processing and this is communicated to the control in such a way that further workpieces are no longer added to the stack (interruption loop 45 and loop 46 for waiting for new workpieces become inactive). The entire loading, stacking and unloading operation is then ended (49).

FIG. 5 shows a second embodiment of the method, wherein firstly the stack is built up completely from all n workpieces from the preceding processing and only then are workpieces removed again from the stack from the bottom to the top in the order of the preceding stack build-up.

The device features required for the description of the method are illustrated in FIGS. 1 to 3. For the second embodiment of the method, it is possible to use optionally the first embodiment of the buffer store according to the invention, wherein the frame 1 is movable relative to the removal device 7, 8, 9 in a vertical direction, or the second embodiment of the buffer store with a stationary frame. In any case, when carrying out the method according to the second embodiment, the frame is not moved relative to the removal device. The vertical movement of the stack in accordance with step (d) is effected by means of synchronous rolling of the vertical transport elements and hence a movement of the stack relative to the frame downward.

The frame 1 of the device according to the invention is continuously in the topmost position (see FIG. 2(A)) and is not moved in this embodiment of the method. Between the loading position 33 and the bottom-most position of the stack, from which workpieces are exclusively removed from the stack in this embodiment, the number of free interspaces between the bearing areas 4 of the vertical transport elements 3 is at least equal to the batch size of the preceding processing step from which the workpieces are removed. For PPG, lapping or DSP of semiconductor wafers having a diameter of 300 mm, the batch size of commercially conventional suitable processing devices is, for example, 15 or 20 semiconductor wafers per processing pass.

The method starts (38) by the installation operator pressing a start button on the device, for example, or an unloading automation signaling to the stacking device that the feeding of workpieces is beginning (39). A sensor, for example a reflective light barrier, checks (41), whether a new workpiece 17 has been placed on loading position 33. As long as no new workpiece has been placed, interrogation 41 is in the waiting loop 46. As soon as a wafer has been placed (step (a) of the method), the vertical transport elements 3 (designated as "toothed belts" in the flowchart) are moved further downward by one position synchronously (43; step (b)). As long as the installation operator or the unloading automation does not signal that loading has been completely carried out (48), gradually all the workpieces of the batch from the preceding processing are stacked one above another by means of interrogation 41 (sensor) and movement of the vertical transport elements by one position downward (43). In this case, by means of branch 50, the loop 64 is iterated n times if the batch consists of n workpieces. After the last workpiece has been inserted, installation operator or automation communicate to the device according to the invention the fact that loading is ended (48). The number of workpieces accommodated is thus known to the buffer store (batch size n).

A sensor checks whether the bottom-most workpiece in the stack touches the removal device (called "unloader" in the flowchart) (40). If this is the case, the workpiece is unloaded (44; step (e)). If this is not the case, the vertical transport elements and hence the stack of workpieces are moved further downward by one position (43; step (d)) and an interrogation is again made as to whether a workpiece now touches the removal device (40). This loop is iterated a maximum of n times (51), and then the unloading process ends independently since all inserted workpieces have evidently been unloaded.

The advantage of the device according to the invention and of both described embodiments of the method according to the invention is that workpieces coming from batch processing can be stacked in a first (in particular fast, but discontinuous) cycle and can be removed again from the stack in the correct order (FIFO) in a second (in particular slow) cycle, in which they are intended to be fed for example to subsequent cleaning or other continuous processing. The stacking of the workpieces that are to be buffered in the meantime one above another in a stack is particularly space-saving and fast (short movement distances for taking up additional workpieces into the stack or releasing them from said stack) and can therefore easily be integrated into the device of the preceding processing. In particular, the horizontal transport system required for the feeding to the stack in accordance with JP2006-032528A is obviated according to the invention. Consequently, the device according to the invention affords a greater saving of space. Moreover, the horizontal transport of the workpieces through between the sprockets into the buffer store is obviated according to the invention. The direct, including manual loading of the stack with subsequent transport of the stack relative to the frame by one position downward is significantly faster, in the case of manual loading significantly less susceptible to incorrect placement and particularly ergonomic. Moreover, on account of the rapid movement of the stack by one position downward and hence the rapid release of the loading position, there is no risk that workpieces could inadvertently be placed one on top of another, which would be possible in the case of the device in accordance with JP2006-032528A.

The first embodiment, wherein a stack is built up in the first cycle of providing the workpieces from the prior process and at the same time is released again in the correct order in the second cycle for subsequent processing (for example cleaning), is characterized by the fact that both the vertical transport elements and the frame move. The second embodiment, wherein firstly a complete stack is formed from all the workpieces of the preceding processing pass and the workpieces are subsequently unloaded again successively in the correct order, is characterized by the fact that only the vertical transport elements 3 move. The frame 1 can therefore be rigid in its position, and drive 34, threaded rod 15 and threaded sleeve 10 in FIG. 2 are consequently obviated. The device required for the second embodiment is therefore constructed significantly more simply than that for the first embodiment. It has fewer movable parts and a simpler control.

The first embodiment is particularly fast because it simultaneously loads and unloads the stack and, consequently, there is only ever a minimum number of workpieces in the stack, the number of which is determined only by the batch size of the preceding processing and the difference between the cycle times of loading and unloading. Since the method according to the invention is preferably used in conjunction with preceding batch processing methods in which a multiplicity of workpieces are provided within a short time or simultaneously, and cleaning in a continuous method preferably takes place afterward, which generally has a comparatively slow cycle rate, in any case there is always a sufficient number of workpieces in the stack, such that waiting times never occur.

If the bearing areas, as illustrated in FIGS. 3(A) to 3(C), are provided with depressions which can accommodate the workpieces, a lateral guidance is provided during the feeding of the workpieces to the stack, which is not provided in the case of JP2006-032528A.

In practice it often happens that batch processing methods are carried out with a smaller quantity of workpieces than corresponds to the possible loading number in the processing method. By way of example, in the preceding processing processes, workpieces may already have been damaged or not processed correctly according to stipulations and, accordingly, may have been separated out. In order that workpieces can furthermore be tracked in groups in a simple manner during the entire processing chain, gaps that arise individually in this way in the batch are not filled ("consolidation") by subsequent workpieces from subsequent groups at every point in time when they arise, because the group association of individual workpieces would thereby be changed.

Both embodiments of the method according to the invention can be slightly modified such that gaps caused by absent workpieces can be passed on in the correct order and position in a group just like the workpieces themselves. For this purpose, the sequences described in FIGS. 4 and 5 are changed such that the installation operator communicates the occurrence of a gap to the control of the buffer store at the corresponding loading instant, for example by pressing a button. In the first embodiment (FIG. 4) the frame then moves one position upward (43) and the vertical transport elements move one position downward (43), such that a vacancy is produced at the relevant location in the stack. During unloading (44) said vacancy is detected and this information is passed on to the, for example, subsequent cleaning, such that there, too, a vacancy is produced at the corresponding position in the group. In the second embodiment (FIG. 5) the vertical transport elements are moved downward by one position (43); a gap is likewise produced in the stack and can be passed on to the subsequent processing in the correct position in the group, as described.

Alternatively, it is possible, if desired, also to bring about "consolidation" by the installation operator, in both embodiments, filling the stack position by position regardless of possible absence of individual semiconductor wafers. In this case, the operator can either terminate the stacking operation at the end of a group by signaling "loading end" (48), as a result of which possibly absent semiconductor wafers and thus vacant positions within the group are displaced to the end of the group (maintenance of group-true wafer assignment), or the operator supplements after consolidation by means of displacing the vacant positions to the end of the group by filling with semiconductor wafers from the next group (cross-group further processing; not group-true wafer assignment). In any case, however, here the relative order of all the workpieces overall with respect to one another is furthermore maintained during the entire stack build-up and take-down process (FIFO principle).

A particularly preferred application of the invention as a buffer prior to cleaning in a continuous method is described below with reference to FIG. 6. The description is given on the basis of the example of semiconductor wafers. However, the method can also be applied to other workpieces which are subjected to cleaning in a continuous method after batch processing.

In this application, each of the workpieces additionally passes through the following steps after step (e) in the specified order:

(g) transport of the workpiece through a cleaning device and cleaning of the workpiece individually in a continuous method, and (i) sorting of the workpiece individually into a cassette by means of a sorting device in the order of passing through the cleaning device.

In this case, in the first cycle of provision by a preceding batch processing method, the semiconductor wafers 17 are successively inserted in typically short succession manually by the installation operator or automatically by an unloading automation into the buffer store according to the invention and are stacked. The bottom-most semiconductor wafer 17 of said stack is in each case removed from the stack by means of a removal device (FIG. 6 illustrates by way of example a removal device formed from rollers 7, transport belts 8 and spindles 9) in the correct order (FIFO), to be precise either at the same time as further loading of the stack in accordance with the first embodiment of the method according to the invention or only after the conclusion of the stacking process in accordance with the second embodiment of the method according to the invention.

The semiconductor wafers 17 then pass, one after the other and in the second cycle determined by the passage speed through the cleaning module, onto a further transport unit 35, the transport belts of which move at the same speed as the transport belts 8 of the removal device. FIG. 6 shows the buffer store with belts 3 with bearing areas 4 and with a stack of semiconductor wafers 17 in a state with a bottom-most semiconductor wafer in the unloading position on the removal device, this state being typical of the first embodiment of the method according to the invention. A preceding semiconductor wafer 52 is already situated on the transport unit 35, a further wafer (60) is already situated in the cleaning module 21 and yet another wafer (61) is already situated in the tray introducing device 26 for the cassette 29.

The cleaning device and the cleaning method itself are not the subject of the invention. Continuous cleaning by means of brushes, rolls or sponges is described below as an exemplary cleaning step. However, the invention can be applied to all continuous or cyclic single-wafer cleaning methods known for the above-mentioned material-removing preprocessing (MWS, lapping, PPG, DSP).

Preferably, the semiconductor wafers of a preprocessing group—in the case of "consolidation", if appropriate, also the semiconductor wafers of a plurality of groups—after cleaning has taken place, are intended to be transferred in the correct order in a dry state into a storage or transport cassette (which is also designated as a tray). Clean and dry semiconductor wafers are required, for example, in order to be able to remove the filled cassette and feed it to a measuring device that measures one or more semiconductor wafers of one or more groups with regard to parameters that are important for the control of the preceding processing method. In this case, it is particularly preferred for cleaning and drying to be effected sufficiently rapidly that at least one semiconductor wafer has already been measured before the next pass of the preceding processing has ended, in order that the installation operator can, if appropriate, still correct settings of the current pass, for example the pass duration (correction of the final thickness of the semiconductor wafers), other parameters, for example for improving the wafer flatness etc.

Preferably, the provision of measured values for correcting the preprocessing is effected in such a timely manner that at least the next but one preprocessing pass can still be corrected, if appropriate. Examples are indicated further below for the unloading, cleaning and tray introducing speeds.

The provision of measurement data precisely with respect to the next but one preprocessing pass can even be particularly advantageous in an individual case since batch processing methods such as lapping, PPG or double-side polishing are often operated with process parameters that alternate from pass to pass. By way of example, the signs of all the drive speeds are often alternated by pass, such that successive processing passes take place with respectively precisely mirrored process kinematics. As a result, the workpieces always experience the same manner of processing; however, front and rear sides are as it were interchanged. The constant alternation between kinematically mirrored or else totally different (different rotational speeds, pressures, etc.) parameters can also be particularly advantageous if, as a result, nonuniform wear of lapping plate, polishing pad or grinding pad, which is generally unavoidable in the case of constant operating conditions, is delayed and, consequently, cleaning operations required for re-establishing the target form of the working disks or working areas have to be carried out correspondingly infrequently. In all these cases, the respective even-numbered processing passes and the respective odd-numbered processing passes are always completely identical, however. The correction in each case after measurement and according to stipulations of the pass before the preceding pass is therefore particularly advantageous.

Figure 6:
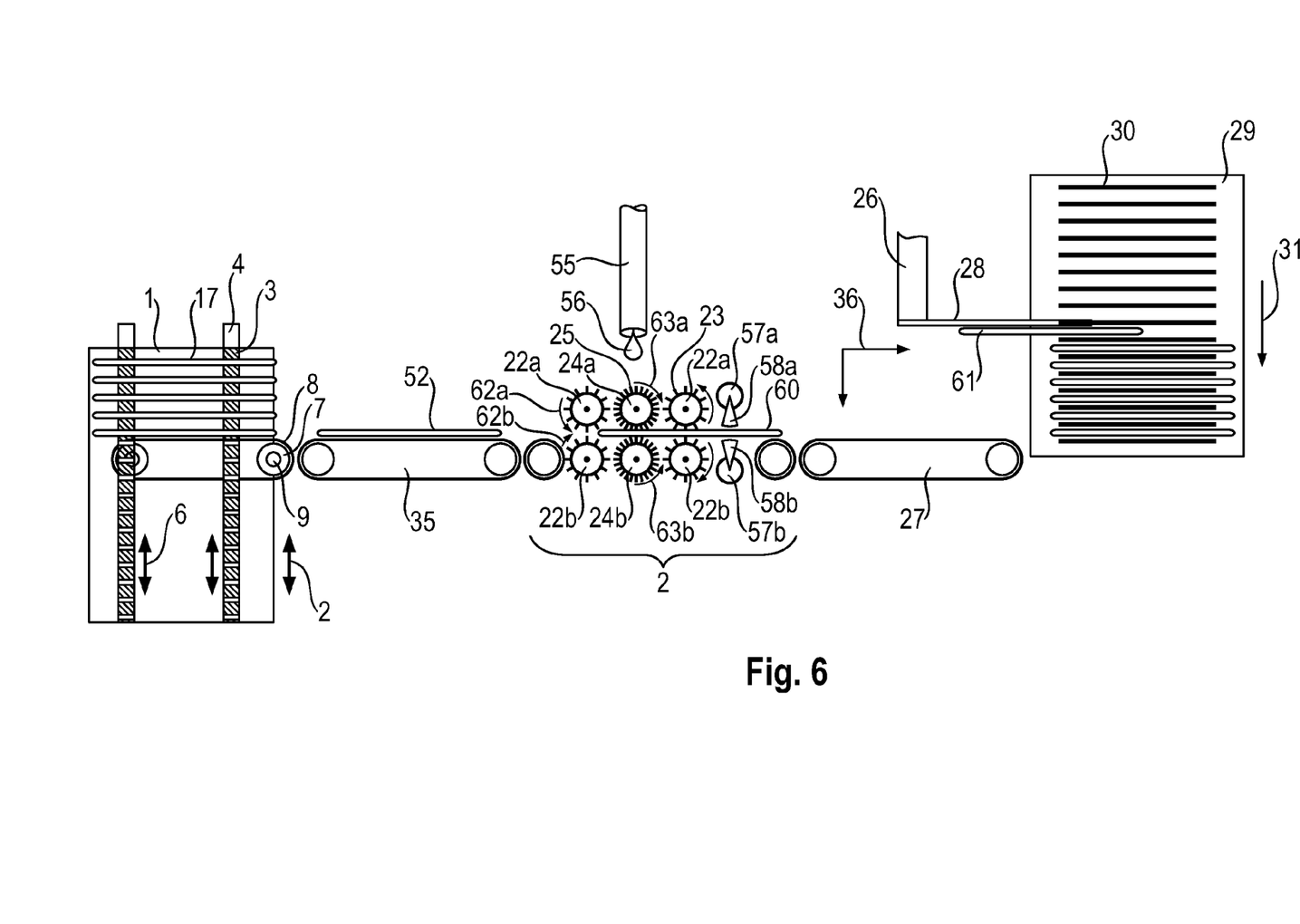
FIG. 6 shows a first embodiment of an integration of the buffer store according to the invention into a complete cleaning device with introduction into trays by means of a robot arm.

The cleaning module 21 indicated by way of example in FIG. 6 comprises elements such as are known from the prior art for brush, roll or sponge cleaning: opposite transport roller pairs 22, consisting of an upper (22a) and a lower transport roller 22b, a cleaning roller pair 24, consisting of an upper (24a) and a lower cleaning roller 24b.

The transport rollers 22 and cleaning rollers 24 substantially differ only in the type (hardness, length, elasticity) and density of their bristles. The bristles 23 of the transport rollers are firmer and more dimensionally accurate and transport the semiconductor wafer by means of rotation 62a (upper transport roller 22a) and 62b (lower transport roller 22b) in the desired direction of movement. The bristles 25 of the cleaning rollers are softer and denser and preferably in both cases rotate (63a, 63b) counter to the direction of movement of the semiconductor wafer 60, such that they have a speed relative and opposite to the surface of the semiconductor wafer 61. The cleaning rollers 24 have a length and are arranged with their axes perpendicular to the direction of movement of the semiconductor wafers in such a way that the bristles 25 touch the semiconductor wafer along a line perpendicular to the direction of movement of the semiconductor wafers and over a full diameter of the semiconductor wafer. On account of the movement of the semiconductor wafers through the cleaning device, the entire surface of the semiconductor wafer on the front and rear sides is simultaneously swept over and thus cleaned by the cleaning rollers 24 rotating in opposite directions.

A cleaning agent 56 is fed to the cleaning rollers 24 by means of a device 55 (metering device). For the exemplary application of a preceding PPG processing of the semiconductor wafers, the cleaning liquid 56 preferably consists of an aqueous surfactant solution, and most preferably consists of pure water.

The drying device 57 shown by way of example in FIG. 6 comprises an upper (57a) and a lower (57b) drying fan. The latter are embodied as a thin gap or as a multiplicity of individual nozzles lined up along a line, which are arranged perpendicular to the direction of movement of the semiconductor wafers and blow a sharp air jet 58a and 58b onto both sides of the semiconductor wafer 60, which covers the entire diameter of the semiconductor wafer and can remove water from the surface of the semiconductor wafer by blowing it away and evaporating it. As a result of the transport movement perpendicular to the course of the drying device 57, both sides of the semiconductor wafer are dried over the whole area in a continuous movement.

Depending on the type and degree of contamination of the semiconductor wafers by the preceding batch processing process (lapping, PPG, pellets grinding, double-sided polishing), different requirements can be imposed in respect of the type and efficacy of the cleaning. The cleaning module 21 shown by way of example in FIG. 6 can be extended by further elements (not shown) in order to meet these requirements. By way of example, it is particularly advantageous if the cleaning takes place "wet in wet", that is to say that the semiconductor wafers still wetted by lapping agent, polishing agent or cooling lubricant (PPG or pellets grinding) from the preceding batch processing are kept wet already in the buffer store, for example by spraying (sprinkling) or flushing nozzles (flushing). Specifically, interim drying-on of contaminants is particularly disadvantageous since dried-on contaminants later are usually particularly difficult to remove or cannot be removed at all. Moreover, as a result of uncontrolled drying-on of working liquids from the preceding batch processing process, for example chemically caustic polishing agent, the semiconductor wafer can be damaged irreversibly.

After cleaning and drying, the semiconductor wafers pass onto a tray introducing transport unit 27, where they are transferred into a cassette 29 by a tray introducing device 26, comprising for example a vacuum gripper 28 and a device for tray introduction by means of a lifting and pushing movement 36. In the cassette 29, the semiconductor wafers are separated from one another by webs 30. The tray introduction takes place in the correct order. All storage and transport cassettes known in the prior art can be used.

In the example shown in FIG. 6, the tray introducing device 26 is embodied by means of a vacuum gripper 28, which grips the semiconductor wafer 61 at its surface facing away from the tray introducing transport unit 27. As a result, it is possible for a subsequent semiconductor wafer already to be positioned on the tray introducing transport unit 27 while the preceding semiconductor wafer is still being transported into the cassette 29 by the tray introducing device 26.

Example

A buffer-storing, cleaning and tray introducing device embodied in accordance with FIG. 6 was operated for cleaning semiconductor wafers from preceding processing by the PPG method. The pure grinding time was approximately 4 minutes during the PPG processing. For loading a PPG batch of 15 semiconductor wafers having a diameter of 300 mm, the installation operator needed approximately 90 seconds; and approximately 120 seconds for unloading. Including ancillary times of the installation (pivoting, lifting and lowering of the upper working disk at the beginning and end of the process; positioning the carriers with the semiconductor wafers after the end of the pass, such that the carrier loaded first was the first to pass into the unloading position after the end of the pass, and removing semiconductor wafers possibly adhering to the upper working disk after the end of the pass), the cycle time was approximately 9.5 minutes. The buffer store was operated with the first method according to the invention (simultaneous stack loading and unloading). With a total unloading duration of two minutes for one PPG pass, the installation operator thus loaded one semiconductor wafer into the buffer store on average every eight seconds.

The removal device (7, 8, 9 in FIG. 1) unloaded one semiconductor wafer every 20 seconds and fed it on a conveyor belt at 2 cm/s to double-side continuous brush cleaning. The transport device of the continuous cleaning thus needed 15 seconds to sweep over a length of the diameter of a semiconductor wafer. Between the semiconductor wafers there was a safety distance of 10 cm on average, corresponding to a sweep-over time of 5 seconds. The passage of a semiconductor wafer from the beginning of unloading from the buffer store until the end of tray introduction into the cassette 29 took 90 seconds. As expected, upon the loading of the last semiconductor wafer from the PPG pass by the installation operator, the stack of semiconductor wafers built up in the buffer store contained the highest number of buffer-stored semiconductor wafers, namely up to eight, depending on the actual unloading speed of the installation operator. The last semiconductor wafer was removed from the buffer store by the removal device 5.5 minutes after the beginning of the loading of the buffer store with the first semiconductor wafer from the PPG pass and was therefore situated in the cassette 7 minutes after the loading of the buffer store with the first semiconductor wafer from the PPG pass. For the installation operator there still remained a time of one minute in order to place the cassette onto a measuring device (and beforehand to remove the cassette with the semiconductor wafers from the preceding PPG pass from the measuring device) and to make setting changes on the PPG installation in accordance with the preceding measurement, before the next PPG pass had to be loaded (9.5 min PPG cycle type minus 7 min total cleaning passage time minus 1 min measuring device placement time yields 1.5 min=loading time). Therefore, enough additional time still remained, such that waiting times never occurred and the installation operator was able to predefine the overall cycle of the entire unloading, buffering/cleaning/drying, measuring and reloading procedure.

The cleaning module 21 was constructed in the manner described above and as illustrated in FIG. 6.

As in the example illustrated in FIG. 6, the tray introducing device 26 was equipped with a vacuum gripper 28, which grips the semiconductor wafer from its top side. The tray introducing process lasted approximately ten seconds. Of these ten seconds, the tray introducing transport unit 27 was blocked for only three seconds for the raising operation. With a time interval of five seconds between successive semiconductor wafers (distance of 10 cm with transport speed of 2 cm/s) therefore, no waiting time arose here either.

The present invention can be used for the buffer-storage of any wafer-type workpieces of uniform size. These include, for example, annular wafers composed of glass or aluminum as substrates for the production of magnetic mass storage devices (hard disks) for computers, optical glasses and "flats", multicrystalline semiconductor wafers for the production of photovoltaic cells and, in particular, monocrystalline semiconductor wafers as starting material for applications in electronics, microelectronics and microelectromechanics.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

LIST OF REFERENCE SIGNS AND ABBREVIATIONS

1 Frame
2 Vertical movement of the frame
3 Vertical transport element
4 Bearing areas
5 Deflection device for vertical transport element
6 Circulating movement of the vertical transport element
7 Deflection roller for horizontal transport belt
8 Horizontal transport belt
9 Spindle of the deflection roller for horizontal transport belt
10 Threaded bush
11 Drive for vertical transport element
12 Driveshaft of the vertical transport elements
13 Rotational movement of the driveshaft of the vertical transport elements
14 Circulating movement of the horizontal transport belt
15 Threaded rod
16 Rotational movement of the threaded rod
17 Workpiece
18 Guide bush (for adjusting height of the frame)
19 Position of the workpiece in the buffer store
20 Centering device for accommodating a workpiece
21 Cleaning module
22a, 22b Transport roller pair
23 Bristles of the transport roller
24a, 24b Cleaning roller pair
25 Bristles of the cleaning roller
26 Tray introducing device
27 Tray introducing transport unit
28 Vacuum gripper
29 Cassette
30 Guide ribs
31 Vertical movement of the cassette
33 Loading position
34 Drive for vertical movement of the frame
35 Transport unit between buffer store and cleaning module
36 Lifting and pushing movement of the gripper for semiconductor wafer for introduction into the target tray
37 Removal movement of the workpiece during automatic removal from the buffer store
38 Process start
39 Input: "loading start"
40 Interrogation/branch: "is bottom=most workpiece touching the removal device?"
41 Interrogation/branch: "new workpiece?"
42 Process step: "move frame upward by one position"
43 Process step: "move vertical transport element downward by one position"
44 Process step: "unload workpiece"
45 Option for process interruption
46 Loop: "waiting for new workpiece"
47 Process step: "move frame downward by one position"
48 Input: "loading end"
49 Process stop
50 Interrogation/branch: "loading ended?"
51 Interrogation/branch: "has this loop been iterated fewer than n times?"
52 Semiconductor wafer completely on horizontal transport device of the removal device
53a, 53b Top most bearing area in horizontal position for accommodating a further workpiece
54a, 54b Bearing areas downstream of the bearing areas 53a, 53b in vertical position
55 Device for feeding cleaning agent
56 Cleaning agent
57a, 57b Drying device
58a, 58b Dry air jet
59 Interrogation "is the frame situated in the bottom-most position?"
60 Workpiece in cleaning module
61 Workpiece on tray introducing device
62a, 62b Rotation of the transport rollers
63a, 63b Rotation of the cleaning rollers
64 Loop until loading has ended
65 Depression in centering device 20
66 Cam for the horizontal alignment of movable bearing areas 4
67 Tooth of the deflection device 5 in the case of the embodiment of the vertical transport element 4 as a chain
68 Tilting movement of movable bearing areas 4
69 Chain articulation in the case of the embodiment of the vertical transport element 4 as a chain
70 Chain link in the case of the embodiment of the vertical transport element 4 as a chain 71 Guide rod for vertical movement of the frame 1
n Number of workpieces in the batch
WS Workpiece (e.g. semiconductor wafer)

What is claimed is:

1. A device for buffer-storing a multiplicity of wafer-type workpieces (17), comprising
   a) a frame (1),
   b) four transport elements (3) which each circulate in a vertical direction around an upper and a lower deflection device (5) connected to the frame, and which are provided, at uniform intervals, with a multiplicity of bearing areas (4) for the horizontal mounting of workpieces (17), wherein at least one of the deflection devices (5) of each transport element (3) is driven and wherein a free space is situated between the transport elements (3), wherein two of the four transport elements (3) are in each case driven by deflection devices (5) which are fixed on a common shaft (12), and wherein the two transport elements (3) in each case have common bearing areas (4) which connect said transport elements (3);
   c) a loading position (33) between the upper deflection devices (5), in which position a respective workpiece (17) is placeable onto the corresponding bearing areas (4), and
   d) a stationary removal device below the loading position (33), comprising a horizontal transport device (7, 8, 9), the first end of which lies within the free space between the transport elements (3), wherein the transport elements (3) are chains, each chain comprising a multiplicity of chain links (70) connected by articulations, wherein the bearing areas (4) are connected to each chain in a manner rotatable about the articulations and have cams (66) such that the rotation of the bearing areas (4) is limited by a first end stop of the bearing areas (4) against the cams (66) of the adjacent bearing areas (4) and by a second end stop of the cams (66) of the bearing areas (4) against the chain links (70), wherein the bearing areas (4), upon circulation (6) of the chains around the deflection devices (5) on account of their weight, are situated against the first end stop in an upwardly moved chain strand and against the second end stop in a downwardly moved chain strand.

2. The device of claim 1, wherein the common bearing areas (4) in each case comprise a centering device (2) in the form of a connecting web having a depression (65) adapted to the form of a workpiece of said workpieces (17).

3. The device of claim 1, wherein the frame (1) is movable by means of a drive (34) in a vertical direction relative to the removal device (7, 8, 9).

4. The device of claim 3, wherein the frame (1) is connected via at least one threaded bushing (10) to a threaded rod (15), which is rotatable by a drive (34) such that the frame (1) is moveable in a vertical direction.

5. The device of claim 1, wherein the frame (1) is stationary.

6. A method for buffer-storing n wafer-type workpieces (17) individually one above another without touching adjacent workpieces in a device of claim 1, where n denotes an integer that is greater than 1, and wherein the method comprises the following steps in the specified order:

(a) inserting a workpiece of said workpiece (17) into the loading position (33),
(b) synchronously rolling the transport elements (3) such that the workpiece (17) is progressively moved relative to the frame (1) by exactly one vertical distance between the bearing areas (4) perpendicular to the workpiece (17) from the loading position (33) downward and the loading position (33) thereby becomes free again, and
(c) repeating steps (a) and (b), until all n workpieces (17) have been inserted, such that a stack of n workpieces (17) arranged one above another and bearing individually on the respective bearing areas has been formed.

7. The method of claim 6, wherein the method comprises the following additional steps in the specified order:
(d) vertically moving the stack by one vertical distance between the bearing areas (4) downward until the bottom-most workpiece (17) bears on the removal device (7, 8, 9),
(e) removing the bottom-most workpiece (17) from the stack by means of a horizontal movement of the removal device (7, 8, 9) and
(f) repeating of steps (d) and (e), until all n workpieces (17) have been removed from the stack.

8. The method of claim 7 using a removal device wherein the frame (1) is movable by means of a drive (34) in a vertical direction relative to the removal device (7, 8, 9), wherein a stack of workpieces (17) is built up by carrying out steps (a) to (c) and at the same time one or a plurality of workpieces (17) are removed from the stack in the order of insertion by carrying out steps (d) to (f), and wherein the vertical movement of the stack in accordance with step (d) is effected by means of a vertical movement of the frame (1) relative to the removal device (7, 8, 9).

9. The method of claim 8, wherein, between steps (a) and (b), the frame (1) is moved upward relative to the removal device (7, 8, 9) by one vertical distance between the bearing areas (4).

10. The method of claim 7, wherein each of the workpieces (17) passes through the following steps after step (e) in the specified order:
(g) transporting the workpiece (17) through a cleaning device (21) and cleaning the workpiece (17) individually in a continuous method, and
(i) sorting the workpiece (17) individually into a cassette (29) by means of a sorting device (26) in the order of passing through the cleaning device (21).

11. The method of claim 10, wherein a further step (h) is effected between step (g) and step (i), the workpiece (17) being dried in said further step (h).

12. The method of claim 7, wherein, first, a complete stack of n workpieces (17) is built up by carrying out steps (a) to (c) and, afterward, the n workpieces (17) are removed again from the stack in the order of insertion by carrying out steps (d) to (f), wherein the frame (1) is not moved relative to the removal device (7, 8, 9) and wherein the vertical movement of the stack in accordance with step (d) is effected by means of synchronously rolling (6) the transport elements (3) and hence movement of the stack relative to the frame (1) downward.

* * * * *

UNITED STATES PATENT AND TRADEMARK OFFICE
CERTIFICATE OF CORRECTION

| | | |
|---|---|---|
| PATENT NO. | : 9,199,791 B2 | Page 1 of 1 |
| APPLICATION NO. | : 13/530358 | |
| DATED | : December 1, 2015 | |
| INVENTOR(S) | : Georg Pietsch et al. | |

It is certified that error appears in the above-identified patent and that said Letters Patent is hereby corrected as shown below:

In the claims

Column 20, Line 1, Claim 6:

After "inserting a workpiece of said"
Delete "workpiece" and
Insert -- workpieces --.

Signed and Sealed this
Nineteenth Day of April, 2016

Michelle K. Lee
*Director of the United States Patent and Trademark Office*